(12) United States Patent
Kim

(10) Patent No.: US 7,887,210 B2
(45) Date of Patent: Feb. 15, 2011

(54) DISPLAY APPARATUS AND METHOD OF ASSEMBLING THE SAME

(75) Inventor: Kwan-Ho Kim, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/559,270

(22) Filed: Sep. 14, 2009

(65) Prior Publication Data

US 2010/0220496 A1    Sep. 2, 2010

(30) Foreign Application Priority Data

Feb. 27, 2009    (KR) .................. 10-2009-0016870

(51) Int. Cl.
*F21V 33/00*    (2006.01)
(52) U.S. Cl. .............. 362/97.3; 362/612; 362/630; 362/631
(58) Field of Classification Search ............ 362/97.1, 362/97.2, 97.3, 612, 632, 633, 634, 630, 362/631
See application file for complete search history.

(56) References Cited

U.S. PATENT DOCUMENTS

2008/0074902 A1 * 3/2008 Oh et al. .................. 362/612
2008/0084520 A1 * 4/2008 Nam et al. ................. 349/65
2008/0266905 A1 * 10/2008 Yeh ........................ 362/630

FOREIGN PATENT DOCUMENTS

| JP | 2004-258236 | 9/2004 |
| KR | 2006-0071553 | 6/2006 |
| KR | 2008-0048347 | 6/2008 |

* cited by examiner

*Primary Examiner*—Laura Tso
(74) *Attorney, Agent, or Firm*—Innovation Counsel LLP

(57) ABSTRACT

In a display apparatus and a method of assembling the display apparatus according to one or more embodiments, a printed circuit board is electrically connected to a lower end of a display panel and disposed in a rear surface of a container. A flexible printed circuit board is contained in the container, and light sources are mounted on the flexible printed circuit board. A connection film electrically connecting the printed circuit board and the flexible printed circuit board is disposed on a bottom portion of the container, and one end of the connection film passes through a fixing hole formed through the bottom portion. The one end of the connection film is electrically connected to the printed circuit board disposed in the rear surface. Thus, movement of the connection film may be limited by an inner wall defining the fixing hole.

16 Claims, 8 Drawing Sheets

DISPLAY APPARATUS AND METHOD OF ASSEMBLING THE SAME

CROSS-REFERENCE TO RELATED APPLICATIONS

This application relies for priority upon Korean Patent Application No. 10-2009-0016870 filed on Feb. 27, 2009, the contents of which are herein incorporated by reference in its entirety.

BACKGROUND

1. Technical Field

The present invention relates generally to a display apparatus and a method of assembling the same. More particularly, embodiments of the present invention relate to a display apparatus that may have an improved assembling process efficiency and a method of assembling the display apparatus.

2. Related Art

In general, a liquid crystal display (LCD) includes a display unit having two display substrates, a liquid crystal layer interposed between the two display substrates, and an electrode formed on each of the two display substrates. Thus, the LCD applies voltages to the electrodes to generate an electric field in the liquid crystal layer and controls an intensity of the electric field to control transmittance of light passing through the liquid crystal layer to display a desired image.

The LCD uses a natural light or an artificial light to display an image. If artificial light is used to display the image, the LCD further includes a backlight unit to provide light to the display unit. As for the light sources in the backlight unit, a cold cathode fluorescent lamp (CCFL) or a plurality of light emitting diodes (LED) may be used.

Recently, the LED has been widely used as the light source for many types of electronic appliances, such as a notebook computer or a cellular phone, due to its low power consumption and light weight. If the LED is employed as the light source, a flexible printed circuit (FPC) board is used to apply power to the LED. For this example, because the FPC board receives the power for the LED from a printed circuit board included in the display unit, additional connection film is required to electrically connect the FPC and the printed circuit board.

SUMMARY

An embodiment of the present invention provides a display apparatus capable of having an improved assembling process efficiency. Another embodiment of the present invention provides a method of assembling the display apparatus.

In an embodiment of the present invention, a display apparatus includes a display panel adapted to display an image, the display panel having a first end and a second end, a backlight unit adapted to provide light to the display panel, a container containing the display panel and the backlight unit, and a printed circuit board, electrically connected to a first end of the display panel, and disposed on a rear surface of the container. The backlight unit includes a plurality of light sources arranged under a second end of the display panel to generate the light, a flexible printed circuit board on which the light sources are mounted, and a connection member adapted to electrically connect to the flexible printed circuit board. A first fixing hole through which one end of the connection member contained in the container is drawn (or passes) is provided in a bottom portion of the container, the one end of the connection member passing through the first fixing hole is electrically connected to the printed circuit board so that the printed circuit board is electrically connected to the flexible printed circuit board, and a movement of the connection member is limited by an inner wall defining the first fixing hole.

In another embodiment of the present invention, a method of assembling the display apparatus includes providing a display panel having a first end and a second end; containing a backlight unit in a container—including mounting a plurality of light sources to generate light on a flexible printed circuit board, containing the flexible printed circuit board on which the light sources are mounted in the container corresponding to a lower portion of the second end of the display panel, disposing a connection film extended from the flexible printed circuit board on a bottom surface of the container, and passing an end of the connection film to a rear surface of the container through a first fixing hole formed through the bottom surface of the container—disposing the display panel on the backlight unit; disposing a printed circuit board, adapted to electrically connect to the first end of the display panel, on the rear surface of the container, and electrically connecting the end of the connection film that passes through the first fixing hole to the printed circuit board.

Thus, the connection film may be fixed to a designated position by the fixing hole and the quality (e.g., reliability, accuracy) of securing the connection film may be improved, thereby improving the efficiency of the assembling process of the display apparatus.

BRIEF DESCRIPTION OF THE DRAWINGS

The above and other advantages of embodiments of the present invention will become readily apparent by reference to the following detailed description when considered in conjunction with the accompanying drawings wherein.

DETAILED DESCRIPTION

Figure 1:
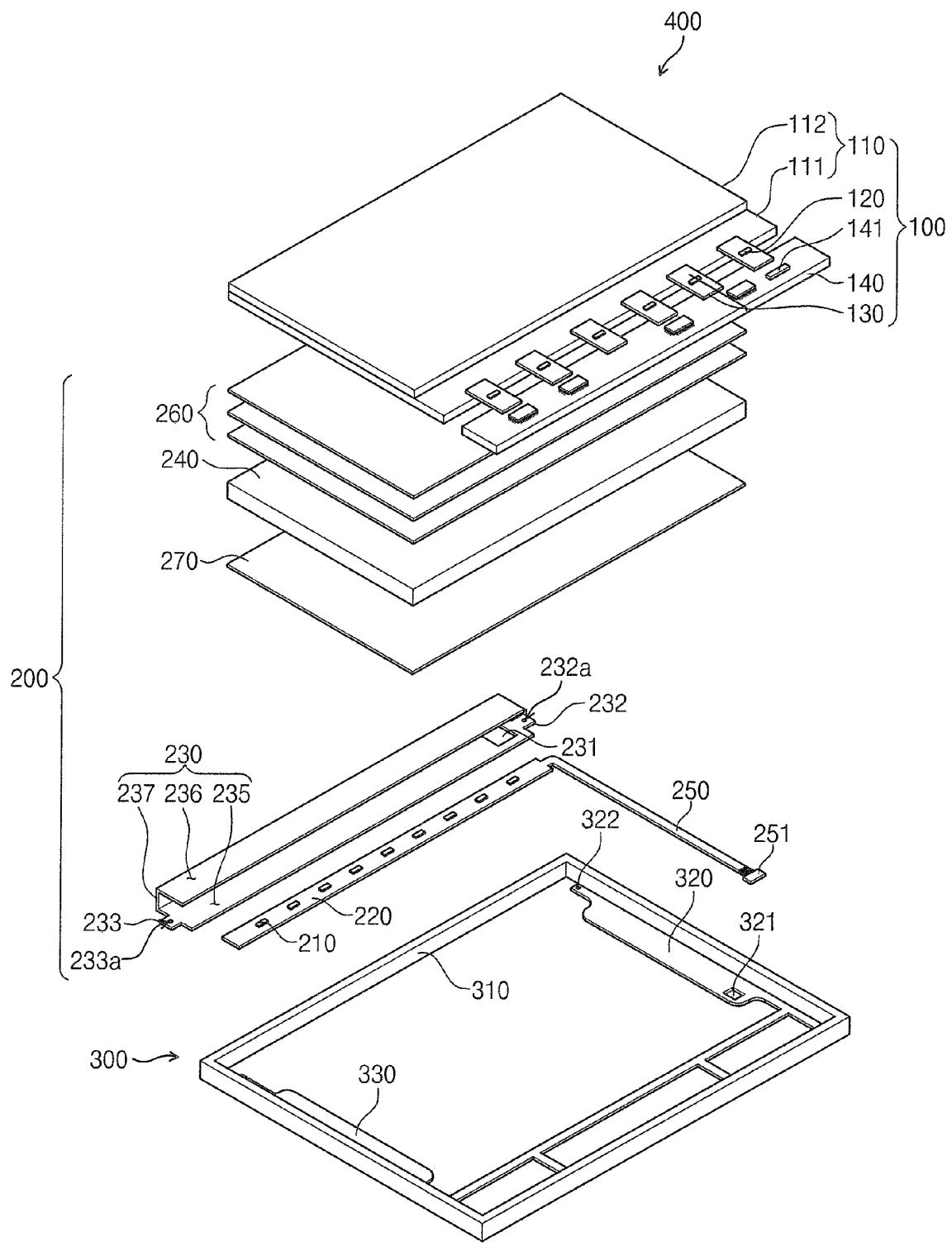
FIG. 1 is an exploded perspective view showing a liquid crystal display according to an embodiment of the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, embodiments of the present invention will be explained in detail with reference to the accompanying drawings.

FIG. 1 is an exploded perspective view showing an example of a liquid crystal display according to an embodiment of the present invention. Referring to FIG. 1, a liquid crystal display (LCD) 400 includes a display unit 100 for displaying an image, a backlight unit 200 arranged in a rear side of the display unit 100 to generate light and provide the light to the display unit 100, and a mold frame 300 (e.g., a container) containing the display unit 100 and the backlight unit 200.

The display unit 100 includes a liquid crystal display panel 110 for displaying the image and a printed circuit board 140. The printed circuit board 140 includes a driving chip 120 providing a driving signal to the liquid crystal display panel 110 and a tape carrier package (TCP) 130 on which the driving chip 120 is mounted. The printed circuit board 140 is electrically connected to the liquid crystal display panel 110 through the TCP 130.

The liquid crystal display panel 110 includes a first substrate 111 having a plurality of pixels, a second substrate 112 in which a plurality of RGB color pixels are formed corresponding to the pixels, and a liquid crystal layer (not shown) interposed between the first substrate 111 and the second substrate 112.

In addition, a plurality of gate lines (not shown) extended in a row direction and a plurality of data lines (not shown) extended in a column direction are formed on the first substrate 111. A plurality of pixel areas is defined in a matrix in the first substrate 111, and the pixels are arranged corresponding to the pixel areas.

Each pixel includes a thin film transistor and a pixel electrode. The thin film transistor includes a gate electrode connected to a corresponding gate line among the gate lines, a source electrode connected to a corresponding data line among the data lines, and a drain electrode connected to the pixel electrode.

The second substrate 112 includes a common electrode (not shown) formed on the RGB color pixels to face the pixel electrode. The liquid crystal layer includes liquid crystal molecules aligned in a certain direction by an electric field formed between the pixel electrode and the common electrode to control transmittance of the light provided from the backlight unit 200. According to another embodiment, the RGB color pixels may be formed on the first substrate. According to another embodiment, both the RGB color pixels and the common electrode may be formed on the first substrate.

The driving chip 120 generates the driving signal to drive the liquid crystal display panel 110 in response to an external signal. The external signal is provided from the printed circuit board 140 and includes an image signal, various control signals, a driving voltage, and so forth.

The liquid crystal display panel 110 requires a gate signal and a data signal to display the image. The driving chip 120 includes a data driver (not shown) that converts the image signal into the data signal to transmit the data signal to the liquid crystal display panel 110. In the present embodiment, a gate driver (not shown) generating the gate signal may be directly formed on the first substrate 111. However, it should not be limited thereto and the gate driver may be formed, for example, in a chip package to be mounted on the first substrate 111 or the TCP 130.

The liquid crystal display panel 110 is electrically connected to the printed circuit board 140 through the TCP 130, and the driving chip 120 is mounted on the TCP 130. Although not shown in figures, however, the driving chip 120 may be mounted on the liquid crystal display panel 110.

The backlight unit 200 includes a plurality of light sources 210 for generating light, a flexible printed circuit (FPC) board 220 on which the light sources 210 are mounted, a back-cover 230 covering the light sources 210 and the FPC board 220, and a light guide plate 240 for receiving the light.

Each light source 210 includes a light emitting diode (LED) which is a point-like light source. The light sources 210 are mounted on a surface of the FPC board 220 at a predetermined interval. The FPC board 220 on which the light sources 210 are mounted is contained in the back-cover 230. The back-cover 230 includes a bottom surface 235, an upper surface 236 that is substantially parallel with the bottom surface 235, and a lateral surface 237 connecting the bottom surface 235 and the upper surface 236. The FPC board 220 is disposed on the bottom surface 235 of the back-cover 230.

The light sources 210 generate light in response to a light generating signal from an external circuit. In the present embodiment, the light generating signal is generated by the printed circuit board 140, and thus the backlight unit 200 includes a connection member 250 to electrically connect the printed circuit board 140 to the FPC board 220. The connection member 250 may be a connection film 250 that extends from one end of the FPC board 220 to be engaged with a connector 141 mounted on the printed circuit board 140. In the present embodiment, the FPC 220 and the connection film 250 may be integrally formed with each other.

The light guide plate 240 has a rectangular plate shape having a size corresponding to that of the liquid crystal display panel 110. The light guide plate 240 includes a light incidence surface, a light exit surface, and a light reflection surface.

The light incidence surface is positioned adjacent to the light sources 210 to receive the light from the light sources 210. The light exit surface extends from a first end of the light incidence surface to exit the light incident through the light incidence surface. The light reflection surface extends from a second end of the light incidence surface to face the light exit surface and reflects the light incident through the light incidence surface to the light exit surface.

In FIG. 1, the light guide plate 240 has a flat panel shape in that a distance between the light exit surface and the light reflection surface is uniformly maintained. Although not shown in figures, the light guide plate 240 may have a wedge shape in that the distance between the light exit surface and the light reflection surface is gradually narrowed as a distance from the light incidence surface increases.

The backlight unit 200 further includes an optical sheet 260 and a reflection sheet 270. The optical sheet 260 is disposed on the light exit surface of the light guide plate 240 to improve optical characteristics of the light exiting from the light exit surface, and the reflection sheet 270 is disposed under the light reflection surface of the light guide plate 240 to reflect the light leaked from the light reflection surface.

The mold frame 300 includes a lateral wall 310 in a rectangular ring shape and a first bottom surface 320 and a second bottom surface 330, which are extended from a lower portion of the lateral wall 310. The reflection sheet 270, the light guide plate 240, and the optical sheet 260 are sequentially disposed on the first and second bottom surfaces 320 and 330, and the liquid crystal display panel 110 is disposed on the optical sheet 260. The TCP 130 is bent to surround an outer surface of the lateral wall 310 of the mold frame 300, and the printed circuit board 140 is disposed on a rear surface of the mold frame 300.

The connection film 250 is electrically connected to the printed circuit board 140 that is disposed on the rear surface of the mold frame 300. In the present embodiment, a first fixing hole 321 is formed through the first bottom surface 320 of the mold frame 300 in order to draw, or pass, one end of the connection film 250 disposed on the first bottom surface 320 of the mold frame 300 to the rear surface of the mold frame 300. A movement of the connection film 250 is limited by an inner wall defining the first fixing hole 321, and the connection film 250 is fixed onto the first bottom surface 320.

Meanwhile, although not shown in FIG. 1, the LCD 400 further includes a top chassis that is coupled with the mold frame 300 while facing the mold frame 300. The top chassis pressurizes the liquid crystal display panel 110 disposed in the mold frame 300 to prevent the liquid crystal display panel 110 from being separated from the mold frame 300.

Figure 2:
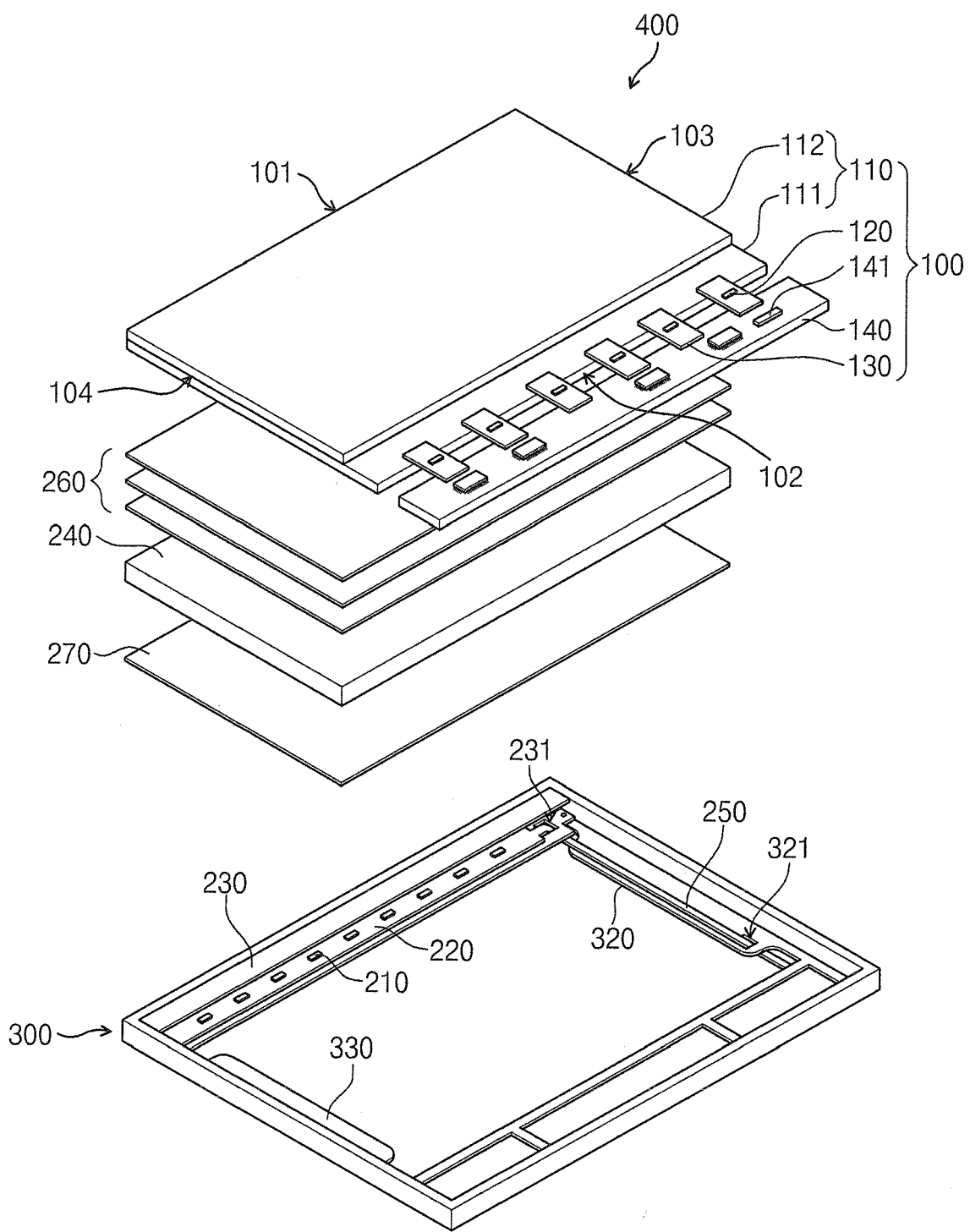
FIG. 2 is a perspective view showing a partially assembled state of a mold frame and a back-cover of FIG. 1 according to an embodiment of the present invention.
Figure 3:
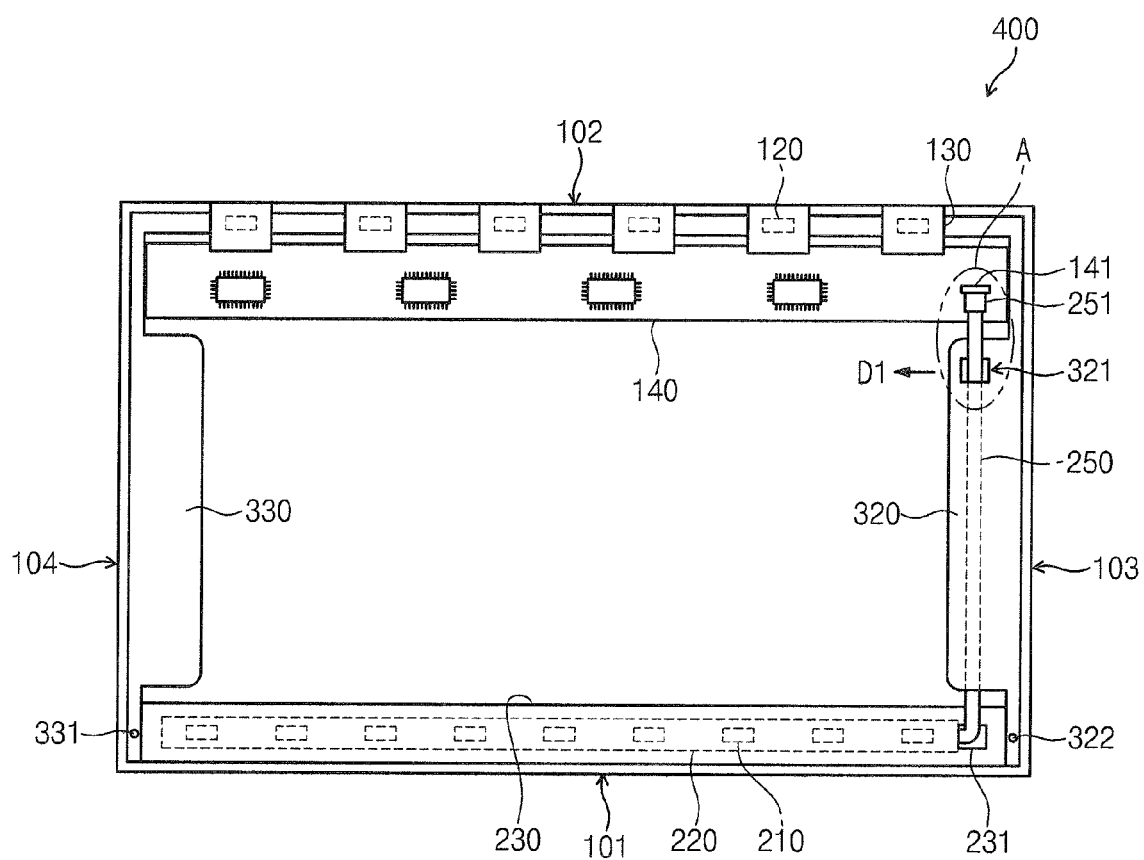
FIG. 3 is a rear plan view showing the liquid crystal display of FIG. 2 according to an embodiment of the present invention.

FIG. 2 is a perspective view showing a partially assembled state of the mold frame and the back-cover of FIG. 1, and FIG. 3 is a rear plan view showing the liquid crystal display of FIG. 2, in accordance with one or more embodiments. Referring to FIGS. 2 and 3, when a side of the liquid crystal display panel 110, which is adjacent to the printed circuit board 140, is defined as a first end 101, the light sources 210 of the backlight unit 200 are arranged under a second end 102 of the liquid crystal display panel 110, which is opposite to the first end 101. In the present embodiment, when the LCD 400 is viewed from a front side thereof, the first end 101 is defined as a lower end and the second end 102 is defined as an upper end.

As described above, when the light sources 210 and the printed circuit board 140 are arranged in different sides (e.g., ends) from each other, a length of the connection film 250 electrically connecting the light sources 210 and the printed circuit board 140 may be longer than with other configurations. In particular, the connection film 250 extends along a third end 103 of the liquid crystal display panel 110 from the second end 102 to the first end 101.

The first bottom surface 320 of the mold frame 300 extends from the lateral wall 310 corresponding to the third end 103 of the liquid crystal display panel 110, and the second bottom surface 330 extends from the lateral wall 310 corresponding to a fourth end 104 of the liquid crystal display panel 110. The reflection sheet 270, the light guide plate 240, and the optical sheet 260 are sequentially disposed on the first and second bottom surfaces 320 and 330 after the back-cover 230, the FPC 220 on which the light sources 210 are mounted, and the connection film 250 are contained in the mold frame 300.

Referring to FIGS. 1 to 3, the back-cover 230 includes a first fixing part 232 and a second fixing part 233, which are protruded from both ends of the bottom surface 235 of the back-cover 230, respectively. The first and second fixing parts 232 and 233 are provided with a first hole 232a and a second hole 233a, respectively. The first bottom surface 320 of the mold frame 300 includes a first engaging recess 322 corresponding to the first hole 232a, and the second bottom surface 330 includes a second engaging recess 331 corresponding to the second hole 233a. The back-cover 230 may be fixed to the mold frame 300 by a first screw (not shown) that engages with the first engaging recess 322 after passing through the first hole 232a and a second screw (not shown) that engages with the second engaging recess 331 after passing through the second hole 233a.

The FPC board 220 on which the light sources 210 are mounted is disposed on the bottom surface 235 of the back-cover 230, and the connection film 250 extended from the FPC board 220 is disposed on the first bottom surface 320 of the mold frame 300.

As shown in FIGS. 2 and 3, the first fixing hole 321 is formed through the first bottom surface 320 of the mold frame 300. In particular, the first fixing hole 321 is formed through one end portion of the first bottom surface 320 which is adjacent or closest to the printed circuit board 140. The connection film 250 disposed on the first bottom surface 320 is drawn (or passed) through the first fixing hole 321 to the rear surface of the mold frame 300. Thus, the connection film 250 may be prevented from being moved to a center portion (that is, a first direction D1) of the mold frame 300 by the inner wall defining the first fixing hole 321.

The second fixing hole 231 is formed through the bottom surface 235 of the back-cover 230. In particular, the second fixing hole 231 is formed in an area where the bottom surface 235 of the back-cover 230 is not overlapped with the first bottom surface 320 of the mold frame 300. With the FPC board 220 disposed on the bottom surface 235 of the back-cover 230, the connection film 250 may be drawn or passed through the second fixing hole 231 to the rear surface of the back-cover 230. The connection film 250 passed through the second fixing hole 231 is disposed on the first bottom surface 320 of the mold frame 300. An inner wall of the back-cover 230, which defines the second fixing hole 231, may prevent the connection film 250 from being moved in the first direction D1.

As described above, if the light sources 210 and the printed circuit board 140 are arranged in the upper end and the lower end of the LCD 400, the ends of the extended connection film 250 may pass through the first fixing hole 321, formed through the mold frame 300 (e.g., first bottom surface 320), and the second fixing hole 231, formed through the back-cover 230, thereby fixing the connection film 250 onto the first bottom surface 320 of the mold frame 300. Thus, the time required to assemble the LCD 400 may be shortened, and may improve the assembling process efficiency.

Figure 4:
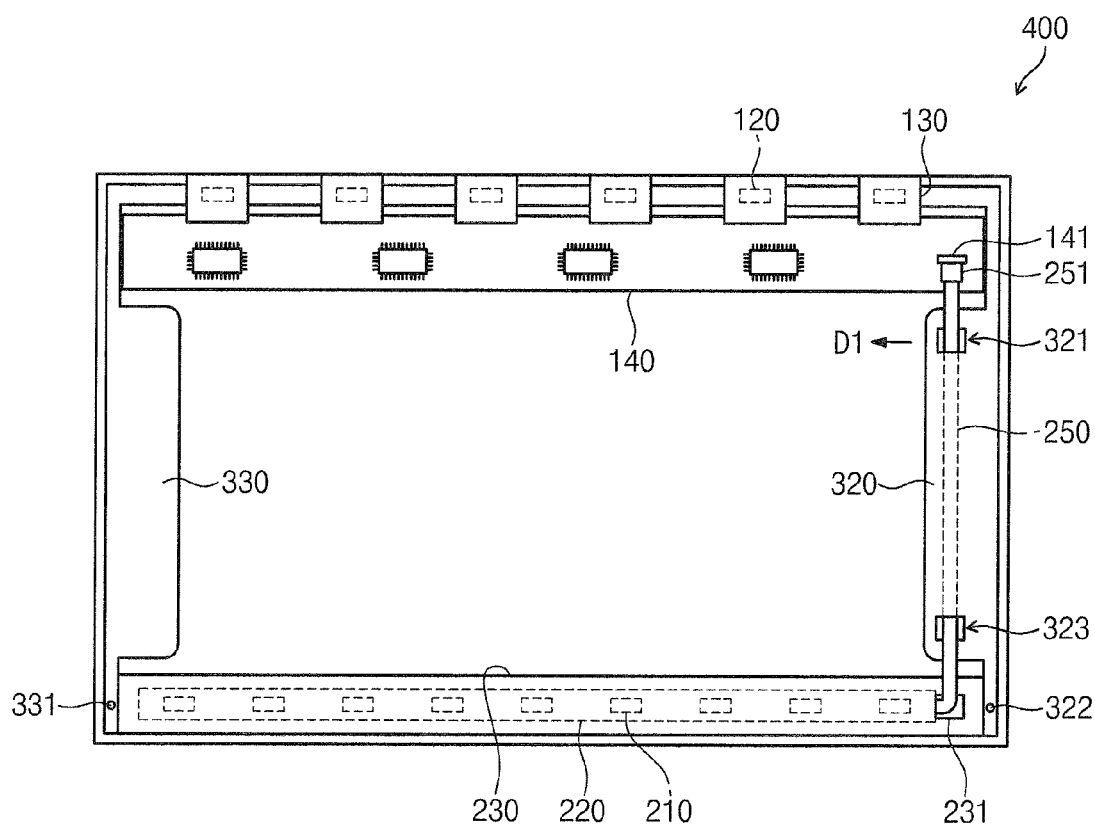
FIG. 4 is a rear plan view showing another example of a liquid crystal display according to an embodiment of the present invention.

FIG. 4 is a rear plan view showing another example of a liquid crystal display according to an embodiment of the present invention. In FIG. 4, the same reference numerals denote the same elements as in FIG. 3, and thus the detailed descriptions of the same elements will be omitted. Referring to FIG. 4, a third fixing hole 323 is further formed through a first bottom surface 320 of a mold frame 300 at a different position from that of a first fixing hole 321. In particular, the third fixing hole 323 may be formed through one end portion of the first bottom surface 320 that is adjacent to a back-cover 230.

Therefore, a connection film 250 drawn or passing through a second fixing hole 231 of the back-cover 230 is disposed on the first bottom surface 320 of the mold frame 300 after passing through the third fixing hole 323. Then, the connection film 250 is drawn or passes through the first fixing hole 321 to a rear surface of the mold frame 300 and electrically connects to a printed circuit board 140.

As described above, when the third fixing hole 323 is additionally formed at a position adjacent to the back-cover 230 to pass through the first bottom surface 320, the connection film 250 may be prevented from being moved in a first direction D1 from the first bottom surface 320 of the mold frame 300.

In FIGS. 3 and 4, the structure in which one or two fixing holes 321 and 323 are formed through the first bottom surface 320 has been suggested, however, the number of fixing holes formed through the first bottom surface 320 is not limited thereto, and the positions of the fixing holes may be changed.

Figure 5:
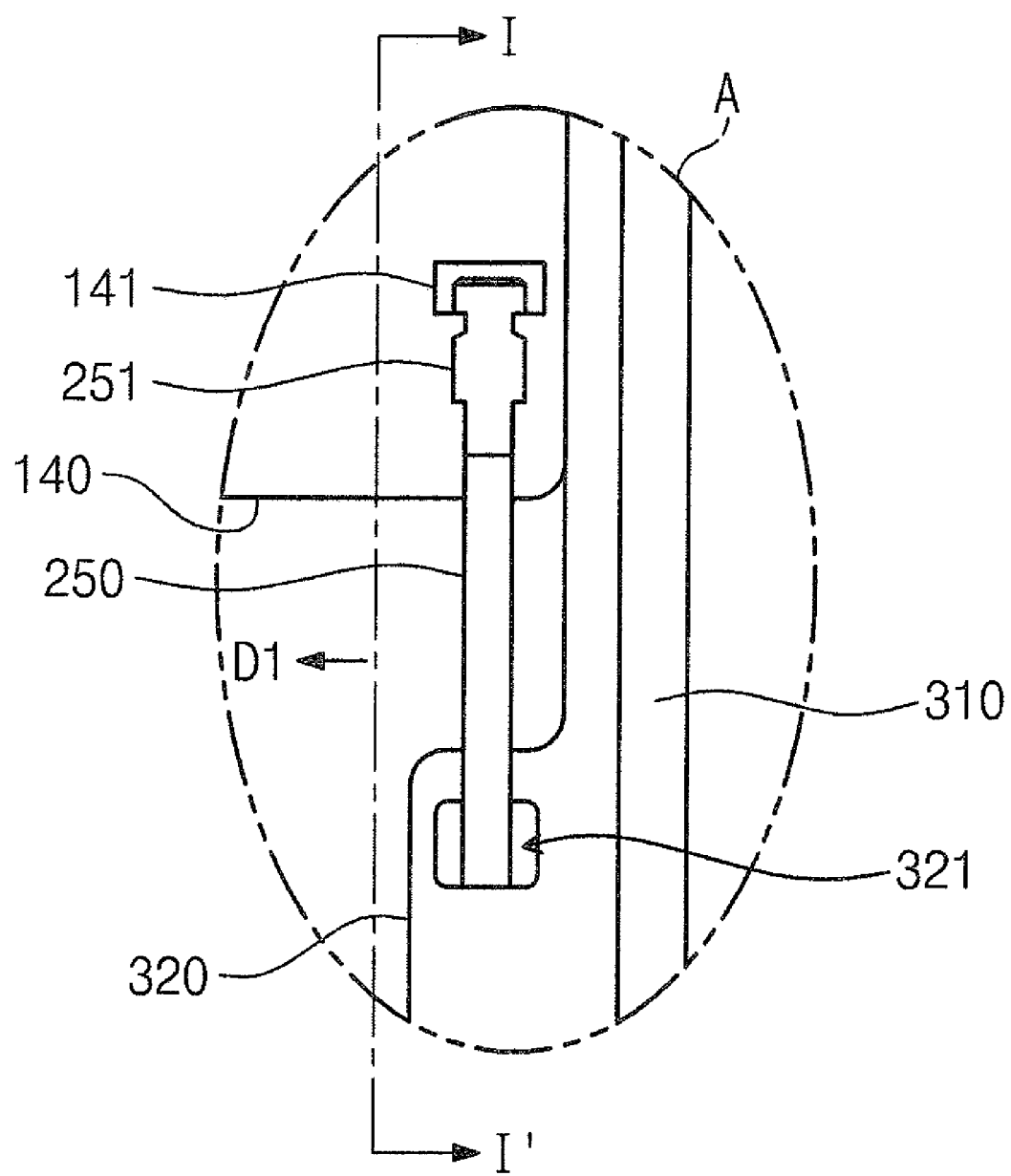
FIG. 5 is an enlarged view showing a portion "A" of FIG. 3 according to an embodiment of the present invention.
Figure 6:
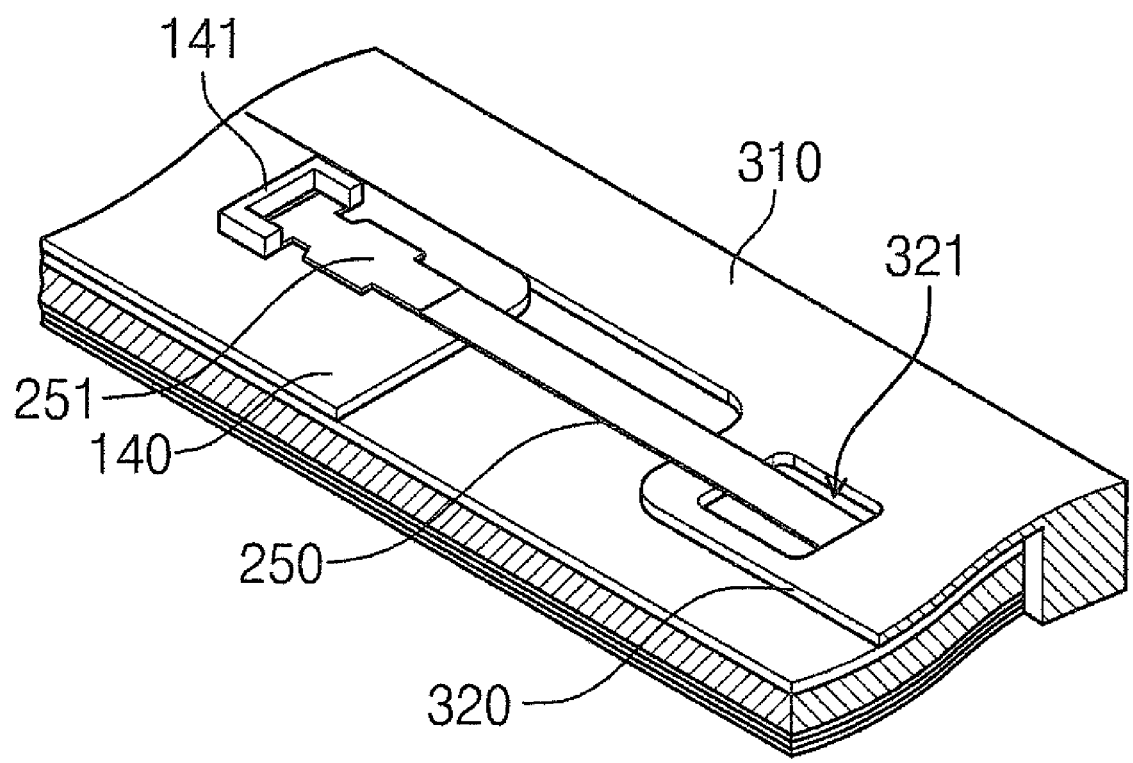
FIG. 6 is a cut-away view with a cut made along a line I-I' of FIG. 5 according to an embodiment of the present invention.

FIG. 5 is an enlarged view showing a portion "A" of FIG. 3, and FIG. 6 is a cut-away view with a cut made along a line I-I' of FIG. 5 according to one or more embodiments. Referring to FIGS. 5 and 6, the connector 141 is mounted on the printed circuit board 140, and an engaging member 251 is coupled with the one end of the connection film 250 to be engaged with the connector 141. With the connection film 250 passed through the first fixing hole 321 formed through the first bottom surface 320 of the mold frame 300, the engaging member 251 coupled with the connection film 250 may be engaged with the connector 141. Accordingly, the connection film 250 may be electrically connected to the printed circuit board 140, and thus the connection film 250 may receive the light generating signal from the printed circuit board 140 to drive the light sources 210.

When the connection film 250 passes through the first fixing hole 321, a side of the connection film 250 is engaged with the inner wall of the first bottom surface 320 defining the first fixing hole 321. Thus, the connection film 250 may be prevented from being moved in the first direction D1 from the first bottom surface 320.

Figure 7:
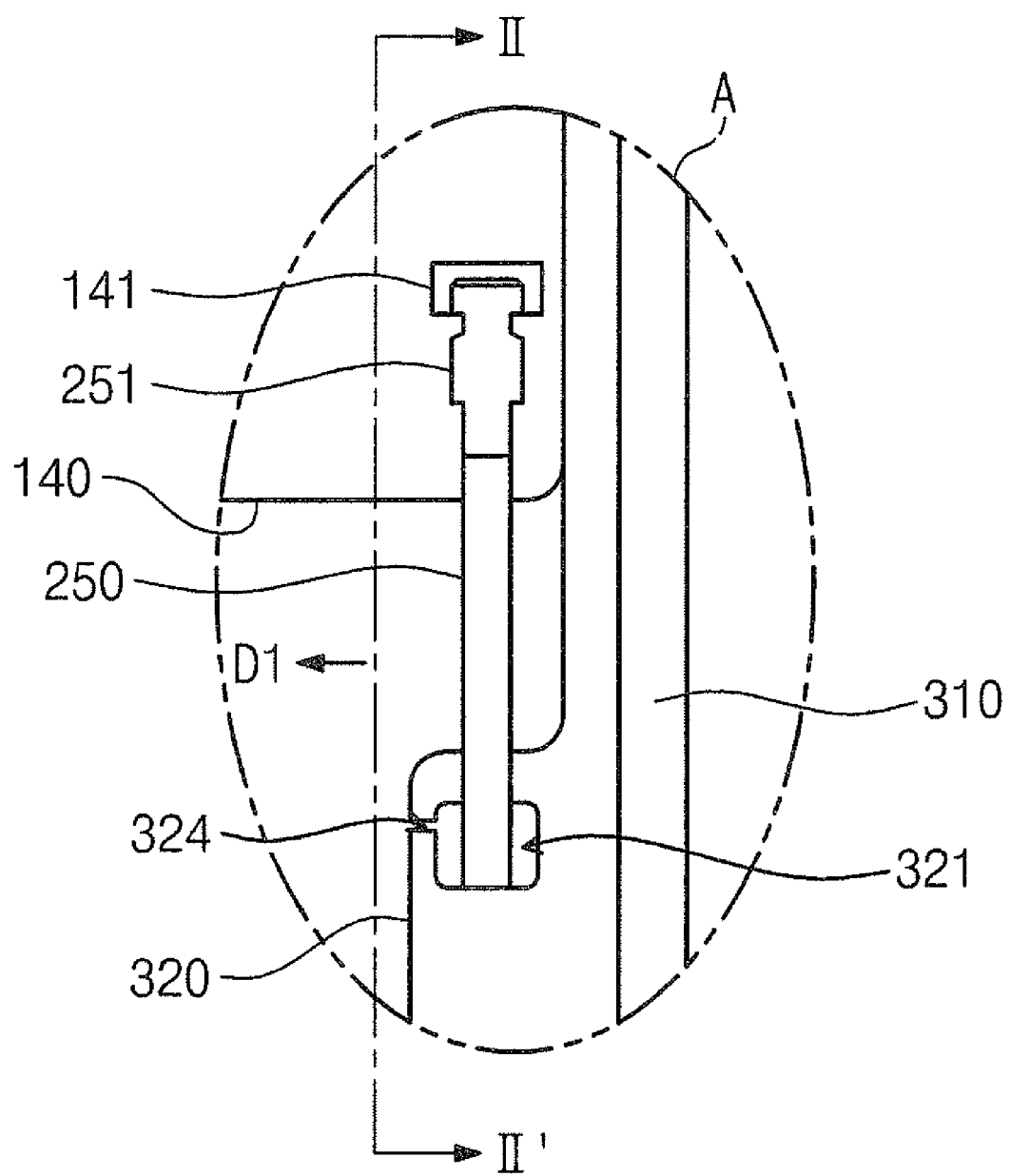
FIG. 7 is an enlarged view showing another example of a portion "A" of FIG. 3 according to an embodiment of the present invention.
Figure 8:
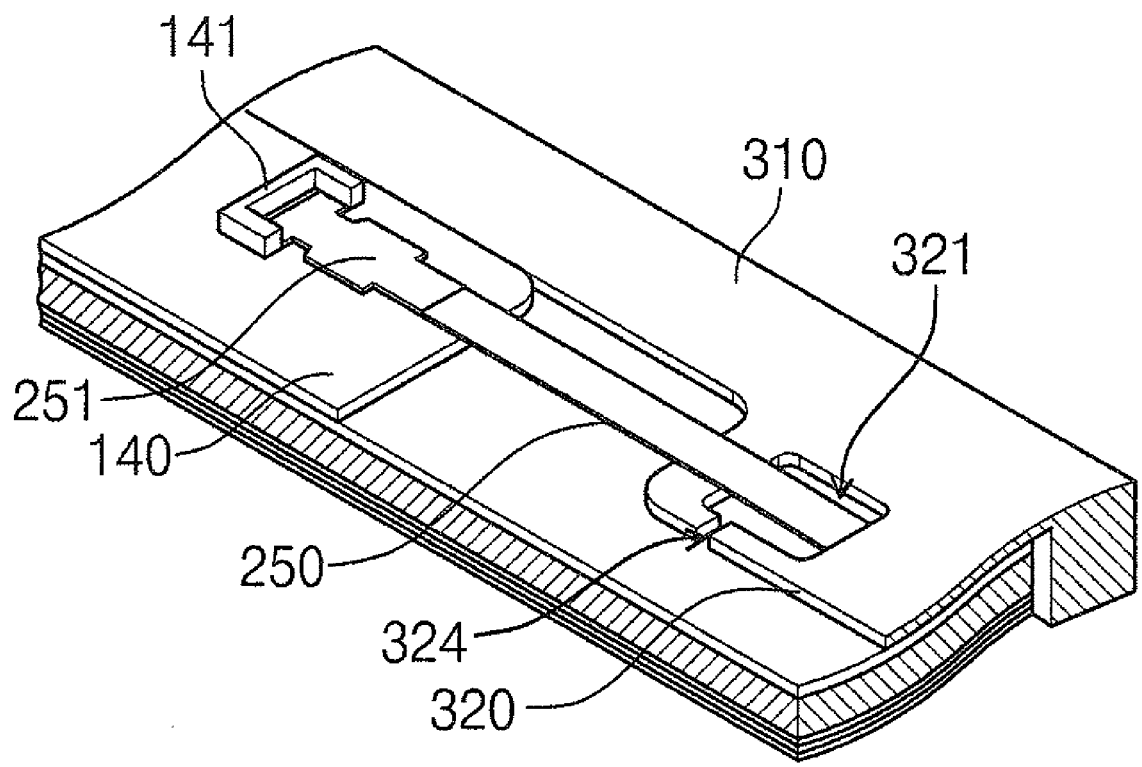
FIG. 8 is a cut-away view with a cut made along a line II-II' of FIG. 7 according to an embodiment of the present invention.

FIG. 7 is an enlarged view showing another example of a portion "A" of FIG. 3, and FIG. 8 is a cut-away view with a cut made along a line II-II' of FIG. 7 according to one or more embodiments. In FIGS. 7 and 8, the same reference numerals denote the same elements as in FIGS. 5 and 6, and thus the detailed descriptions of the same elements will be omitted. Referring to FIGS. 7 and 8, among four inner walls defining the first fixing hole 321 formed through the first bottom surface 320 of the mold frame 300, the first bottom surface 320 is cut from the inner wall that is closest to the second bottom surface 330 in the first direction D1 to form a guide hole 324. That is, the first fixing hole 321 is opened by the guide hole 324 toward the second bottom surface 330.

The connection film 250 may be passed through the guide hole 324 and inserted into the first fixing hole 321. The guide hole 324 may be formed to have a width that is thinner than a thickness of the connection film 250 so that the connection film 250 may be prevented from being separated from (e.g., slipping back out through) the guide hole 324.

Although not shown in figures, as another embodiment, the guide hole 324 may be formed by cutting the first bottom surface 320 from the inner wall that is substantially parallel with the printed circuit board 140 in a second direction D2 that is substantially perpendicular to the first direction D1. In this case, the first fixing hole 321 is opened by the guide hole 324 toward the printed circuit board 140.

As described above, when the first fixing hole 321 is partially opened by the guide hole 324, the connection film 250 disposed on the first bottom surface 320 of the mold frame 300 may be easily drawn or placed through the first fixing hole 321 to the rear surface of the mold frame 300, thereby simplifying the assembling processes of the LCD 400.

Although various embodiments of the present invention have been described, it is understood that the present invention should not be limited to these embodiments but various changes and modifications can be made by one of ordinary skill in the art that are within the spirit and scope of the present invention as hereinafter claimed.

What is claimed is:

1. A display apparatus comprising:
  a display panel displaying an image, the display panel having a first end and a second end;
  a backlight unit providing light to the display panel; wherein the backlight unit comprises:
    a plurality of light sources arranged under the second end of the display panel to generate the light;
    a flexible printed circuit board on which the light sources are mounted; and
    a connection member electrically connected to the flexible printed circuit board,
  a container to contain the display panel and the backlight unit; and
  a printed circuit board electrically connected to the first end of the display panel and disposed on a rear surface of the container, wherein
    a first fixing hole through which one end of the connection member contained in the container passes is provided in a bottom portion of the container,
    the one end of the connection member that passes through the first fixing hole is connected to the printed circuit board so that the printed circuit board is electrically connected to the flexible printed circuit board, and
    a movement of the connection member is limited by an inner wall defining the first fixing hole.

2. The display apparatus of claim 1, wherein:
with the display panel viewed from a front side thereof, the first end of the display panel is defined as a lower end and the second end of the display panel is defined as an upper end, and
wherein the connection member extends along a third end of the display panel, which is substantially perpendicular to the first and second ends.

3. The display apparatus of claim 2, wherein the container comprises a lateral wall of a rectangular ring shape, and the bottom portion comprises a first bottom surface extended from the lateral wall corresponding to the third end of the display panel and a second bottom portion extended from the lateral wall corresponding to a fourth end of the display panel, which is substantially parallel with the third end.

4. The display apparatus of claim 3, wherein the first fixing hole is formed through the first bottom surface.

5. The display apparatus of claim 4, wherein the first fixing hole is formed in a rectangular shape, the first bottom surface is provided with a guiding hole such that the first fixing hole is opened by partially cutting an inner wall adjacent to the second bottom surface among four inner walls defining the first fixing hole, and the connection member passes through the first fixing hole after passing through the guide hole.

6. The display apparatus of claim 3, wherein the first fixing hole is formed in an end of the first bottom surface adjacent to the first end of the display panel.

7. The display apparatus of claim 1, wherein the backlight unit comprises:
a light guide plate receiving the light through a side surface thereof adjacent to the light sources to output the light through an upper surface thereof; and
a back-cover coupled with an end portion where the side surface of the light guide plate is arranged to cover the light sources and the flexible printed circuit board.

8. The display apparatus of claim 7, wherein a bottom surface of the back-cover, on which the flexible printed circuit board is disposed, is provided with a second fixing hole through which the connection member connected to the flexible printed circuit board passes, and the connection member that passes through the second fixing hole is disposed on the bottom portion.

9. The display apparatus of claim 8, wherein both ends of the connection member are fixed onto the bottom portion by the first and second fixing holes.

10. The display apparatus of claim 7, wherein the bottom surface of the back-cover is fixed onto the bottom portion of the container, and the second fixing hole is formed in an area where the bottom surface of the back-cover and the bottom portion are not overlapped with each other.

11. The display apparatus of claim 7, wherein the backlight unit further comprises:
a reflection sheet arranged under the light guide plate to reflect the light leaked from the light guide plate; and
an optical sheet disposed on the light guide plate to diffuse or condense the light exiting from the light guide plate.

12. The display apparatus of claim 1, wherein the connection member comprises a connection film that is integrally formed with the flexible printed circuit board, and the flexible printed circuit board comprises a connector electrically connected to an end of the connection film.

13. The display apparatus of claim 1, wherein each of the light sources comprises a light emitting diode.

14. A method of assembling a display apparatus, the method comprising:
providing a display panel having a first end and a second end;
containing a backlight unit in a container, wherein the containing of the backlight unit comprises:
mounting a plurality of light sources to generate light on a flexible printed circuit board;
containing the flexible printed circuit board on which the light sources are mounted in the container corresponding to a lower portion of the second end of the display panel;
disposing a connection film extended from the flexible printed circuit board on a bottom surface of the container; and
passing an end of the connection film to a rear surface of the container through a first fixing hole formed through the bottom surface of the container;
disposing the display panel on the backlight unit;
disposing a printed circuit board, adapted to electrically connect to the first end of the display panel, on the rear surface of the container, and
connecting the end of the connection film that passes through the first fixing hole to the printed circuit board so that the connection film is electrically connect to the printed circuit board.

15. The method of claim 14, further comprising containing a back-cover in the container to cover the light sources and the flexible printed circuit board prior to containing the flexible printed circuit board in the container, and wherein the flexible printed circuit board is disposed on a bottom surface of the back-cover.

16. The method of claim 15, further comprising passing the connection film extended from the flexible printed circuit board to a rear surface of the back-cover through a second fixing hole formed through the bottom surface of the back-cover, and wherein the connection film passing through the second fixing hole is disposed on the bottom surface of the container.

* * * * *